United States Patent
Shida

(10) Patent No.: US 7,693,214 B2
(45) Date of Patent: Apr. 6, 2010

(54) RECEIVING DEVICE AND ANALOG-TO-DIGITAL CONVERSION DEVICE

(75) Inventor: Yasunari Shida, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 1196 days.

(21) Appl. No.: 11/142,237

(22) Filed: Jun. 2, 2005

(65) Prior Publication Data
US 2005/0271135 A1    Dec. 8, 2005

(30) Foreign Application Priority Data
Jun. 3, 2004    (JP) ............... 2004-166130

(51) Int. Cl.
H03H 7/30    (2006.01)
H04B 1/10    (2006.01)
(52) U.S. Cl. ...................... 375/232; 375/350
(58) Field of Classification Search ......... 375/232–233, 375/319, 350, 355; 370/286, 289–291
See application file for complete search history.

(56) References Cited

U.S. PATENT DOCUMENTS

| | | | | |
|---|---|---|---|---|
| 5,353,312 A * | 10/1994 | Cupo et al. | ................. | 375/354 |
| 5,946,354 A * | 8/1999 | Ashley et al. | ................. | 375/260 |
| 5,991,347 A * | 11/1999 | Kim et al. | ................. | 375/355 |
| 6,026,418 A * | 2/2000 | Duncan, Jr. | ................. | 708/309 |
| 6,522,282 B1 | 2/2003 | Elbornsson | | |
| 6,621,862 B1* | 9/2003 | Dabell | ................. | 375/229 |
| 6,747,936 B1* | 6/2004 | Shim | ................. | 369/59.22 |
| 2002/0150185 A1* | 10/2002 | Meehan et al. | ................. | 375/347 |

FOREIGN PATENT DOCUMENTS

| JP | 03-171835 | 7/1991 |
|---|---|---|
| JP | 04-249429 | 9/1992 |

(Continued)

OTHER PUBLICATIONS

Simon Haykin, "Adaptive Filter Theory", translated by Hiroshi Suzuki, et al., Kagaku Gijutsu Shuppansha, Inc., pp. 414-421.
Japanese Office Action dated Jan. 19, 2010.

*Primary Examiner*—Khanh C Tran
(74) *Attorney, Agent, or Firm*—McGinn IP Law Group, PLLC

(57) ABSTRACT

Disclosed is a receiving device which comprises first and second AD converters for inputting a received analog signal and converting the analog signal to digital signals in response to sampling clock signals of mutually different phases, first and second adaptive equalizers for respectively receiving outputs of the first and second AD converters, third and fourth adaptive equalizers for respectively receiving outputs of the second and first AD converters, a first adder for adding the outputs of the first and second adaptive converters, a second adder for adding the outputs of the third and fourth adaptive equalizers, a first decision unit for receiving the output of the first adder, deciding a received symbol for output, and outputting a decision error, a second decision unit for receiving the output of the second adder, deciding a received symbol for output, and outputting a decision error, and a multiplexing circuit for multiplexing the received symbols output from the first and second decision units, for output. The decision error from the first decision unit is supplied to the first and second adaptive equalizers, and the decision error from the second decision unit is supplied to the third and fourth adaptive equalizers.

24 Claims, 12 Drawing Sheets

FOREIGN PATENT DOCUMENTS

| | | |
|---|---|---|
| JP | 04-326869 | 11/1992 |
| JP | 2002-100988 | 4/2002 |
| JP | 2002-246910 | 8/2002 |
| JP | 2003-317403 | 11/2003 |

* cited by examiner

RECEIVING DEVICE AND ANALOG-TO-DIGITAL CONVERSION DEVICE

FIELD OF THE INVENTION

The present invention relates to a receiving device having an analog-to-digital conversion device. More specifically, the invention relates to a time-interleaved analog-to-digital conversion device and the receiving device having the analog-to-digital conversion device.

BACKGROUND OF THE INVENTION

Some examples of typical data transmission systems will be outlined in the below. First, an optical transmission system will be described with reference to FIG. 2. As shown in FIG. 2, in the transmission system using an optical fiber, in transmitters 10 and 19 on transmitting sides, transmission symbols (digital signals), each of which is the information transmission unit, are converted to analog signals by digital-to-analog converters not shown, and the analog signals are supplied to electric-to-optical converters 12 and 17 such as semiconductor lasers (LDs) and are output into optical fibers 14 and 15 from the electric-to-optical converters 12 and 17 as optical signals. The optical signals that propagate through the optical fibers 14 and 15, respectively, are converted to electric signals by optical-to-electric converters 16 and 13 such as photo diodes (PDs) on receiving sides. Receivers 18 and 11 that receive the electric signals from the optical-to-electric converters 16 and 13, respectively, sometimes execute adaptive equalization, thereby obtaining received symbols after having converted the analog signals to the digital signals using analog-to-digital converters (referred to as "AD converters" or "ADCs") not shown. With this arrangement, characteristics are improved.

FIG. 3 shows an example of a configuration of a transmission system (a full duplex transmission system) using a twisted pair of cables. Referring to FIG. 3, in this transmission system, each of transmitters 20 and 27 on the transmitting sides converts a transmission symbol (a digital signal) to an analog signal by a digital-to-analog converter not shown, and sends out the analog signal to a transmission line 24 via a hybrid circuit 22 or 26 and a transformer 23 or 25, respectively. Receivers 28 and 21 receive signals sent on the transmission line 24 via the transformers 25 and 23 and the hybrid circuits 26 and 22, respectively, and convert the received analog signals to the digital signals using AD converters not shown. Then, the digital signals are subjected to adaptive waveform equalization. Depending on the system, suppression processing (noise cancellation) of noises such as an echo, a near-end crosstalk, and a far-end crosstalk is also executed.

In recent years, in the receivers in FIGS. 2 and 3 in the transmission system, with a higher transmission speed, the higher speed and the higher accuracy of the AD converter have become necessary. The high speed operation of the AD converter means a high conversion rate (sampling frequency). Further, for implementation of the higher accuracy of the AD converter, in addition to improvement in DC characteristics such as a high resolution, an offset, and a linear characteristic, improvement in a dynamic characteristic (AC characteristic) such as reduction in a sampling clock skew, for example, is also required. Then, the resolution of a high-speed AD converter is comparatively coarse, and implementation of the higher speed and the higher accuracy with one AD converter is difficult, thus leading to a rise in the price.

Then, as a design system for implementing AD conversion with the higher speed and high accuracy, an AD conversion device in which a plurality of AD converters are arrayed in parallel and the respective AD converters are operated with an interleaving method using time division (referred to as an "time-interleaved AD conversion device) has been hitherto employed (refer to Patent Document 1, for example). By driving the plurality of AD converters by frequency-divided clocks of multiple phases mutually different to one another in the time-interleaved AD conversion device, the time-interleaved AD conversion device can accommodate the higher speed while suppressing an increase in the conversion rates of the respective AD converters.

FIG. 10 shows an example of a typical configuration of a conventional time-interleaved AD conversion device. Referring to FIG. 10, this time-interleaved AD conversion device 300 includes first through fourth AD converters 311, 312, 313, and 314 to which an analog input terminal is connected in common. The first through fourth AD converters 311, 312, 313, and 314, respectively, execute analog-to-digital conversion responsive to four-phase clock signals CLK1, CLK2, CLK3, and CLK4 that have phases equally spaced each other.

The first through fourth AD converters 311, 312, 313, and 314 that receive a time-continuous analog signal sample the analog signal at equal intervals by time division and convert the analog signal to digital signals. That is, from the first through fourth AD converters 311, 312, 313, and 314, sampled value signals, which are the digital signals obtained by converting the input signals (analog signals) at sampling time points 4×k+0, 4×k+1, 4×k+2, and 4×K+3 of discrete times, in which k is an integer equal to or larger than zero, are output, respectively. The first AD converter 311 outputs a digital signal series D0, D4, and D8 in synchronization with the sampling clock signal CLK1. The second AD converter 312 outputs a digital signal series D1, D5, and D9 in synchronization with the sampling clock signal CLK2 (with a phase thereof being lagged behind the CLK1 by 90 degrees). The third AD converter 313 outputs a digital signal series D2, D6, and D10 in synchronization with the sampling clock signal CLK3 (with a phase thereof being lagged behind the CLK2 by 90 degrees). The fourth AD converter 314 outputs a digital signal series D3, D7, and D11 in synchronization with the sampling clock CLK4 (with a phase thereof being lagged behind the CLK3 by 90 degrees). A parallel-to-serial conversion circuit 320 receives in parallel the digital signals D0, D1, D2, and D3 output from the first through fourth AD converters 311, 312, 313, and 314, respectively, and serially outputs a digital signal series D0, D1, D2, and D3, obtained by multiplexing these in a predetermined timing sequence, as output signals. Then, the parallel-to-serial conversion circuit 320 receives in parallel the digital signals D4, D5, D6, and D7 output from the first through fourth AD converters 311, 312, 313, and 314, respectively, and serially outputs a digital signals series D4, D5, D6, and D7 obtained by multiplexing these in a predetermined timing sequence, as output signals.

In the time-interleaved AD conversion device shown in FIG. 10, it is necessary for the phases of the four-phase clocks CLK1, CLK2, CLK3, and CLK4 are spaced apart at accurately equal intervals. That is, when non-uniformity in sampling periods caused by timing deviation and the like (skews) in the four-phase clocks CLK1, CLK2, CLK3 and CLK4 occurs, inconvenience is caused. This will be described with reference to FIG. 11.

FIG. 11 is a diagram for schematically explaining states of characteristic deterioration in AD converters caused by skews of the sampling clock in the time-interleaved AD conversion device constituted from the two AD converters. Referring to FIG. 11, a horizontal axis indicates time, while a vertical axis indicates signal amplitude. Further, referring to FIG. 11, a timing indicated by an ADC1 shows the sampling phase of a first AD converter. An ADC2 indicates the ideal sampling phase of a second AD converter when the sampling phase ADC 1 of the first AD converter is used as a reference. An analog signal in FIG. 11 indicates the waveform of the time-continuous analog signal supplied as the input signal to the two AD converters. Points of intersection of the timings ADC1 and ADC2 and the waveform of the analog signal indicate time discrete sampled values (ideal sampled values) by the first and second AD converters.

Timings indicated by skew arrows (SKEWs) in FIG. 11 show the timings at which the sampling phases at the timings ADC2 have been deviated by the skews (SKEWs) of the sampling clock.

As shown in FIG. 11, the sampling phases at the timings ADC2 are deviated due to the skews (SKEWs). For this reason, a deviation (noise) is generated between a sampled value under the condition in which a skew (SKEW) is present and an ideal sampled value (the point of intersection of the ADC2 and the analog signal). In case a timing skew is indicated by $\Delta t$, a magnitude of the noise $\Delta V$ is given by $[df(t)/dt]$ $\Delta t$ (in which $f(t)$ indicates the waveform of the time-continuous analog signal), and the magnitude depends on the magnitude of the skew $\Delta t$ and also increases at a location where a differentiation coefficient $df(T)/dt$ of $f(t)$, which is the change rate of the signal waveform, is large (or the location with a large slew rate).

Then, in order to cope with such phase and timing variations, traditionally, a correction circuit for executing phase adjustment has been provided in the time-interleaved AD conversion device.

In Patent Document 1, a configuration having an FIR (Finite Impulse Response) filter is disclosed. In this configuration, the FIR filter receives digital signals from a time-interleaved AD conversion device driven by an even number clock and an odd number clock from a frequency divider. The digital signals output from the FIR filter are made to be a timing pulse accurately shifted by a half period of a sampling clock signal supplied to two AD converters, and the one obtained by delaying the output of a first AD converter by an integer times of the period of the sampling clock signal. That is, outputs of the two output terminals of the FIR filter are alternately output by a multiplexer, thereby allowing accurate shifting of the outputs of the AD converters by the half period of the sampling clock signal, for output. However, in the configuration described in this Patent Document 1, filter coefficients of the FIR filter are set in advance.

Further, In Patent Document 2, a configuration having a unit for calculation of timing offsets is disclosed. In this configuration, the unit for calculation of timing offsets receives digital output signals of a plurality of AD converters juxtaposed, derives timing error estimate values from the sum of the squared differences of sampled values to obtain timing offsets. Then, based on the output of the calculation unit, the output of each AD converters is corrected and multiplexed by a compensation and multiplexing unit. Incidentally, in the Patent Document 2, the calculation unit estimates the amount of compensation using a derivative difference arising from the timing offsets. Then, sampling phase correction is carried out using only a multiplication and a subtraction. Accordingly, a phase shift in a strict sense is not carried out.

FIG. 12 is a diagram showing an example of a configuration of a receiver using a time-interleaved AD conversion device that includes a correction circuit. The receiver shown in FIG. 12 is used as the receiver of the transmission system shown in FIG. 2 or 3, for example. Referring to FIG. 12, this receiver includes two AD converters 301 and 302, a correction circuit 303, a parallel-to-serial converter 304, a divide-by-N frequency division multi-phase circuit 307, an adaptive equalizer 305, and a decision unit 306. The analog input terminals of the AD converters 301 and 302 that input a received analog signal are connected in common, and the AD converters 301 and 302 are placed in parallel. The correction circuit 303 inputs digital signals output from the two AD converters 301 and 302. The parallel-to-serial converter 304 receives two outputs from the correction circuit 303, multiplexes them, for output. The divide-by-N frequency division multi-phase circuit 307 frequency divides a reference clock by N and outputs multi-phase clocks. The decision unit 30 carries out decision of data. The divide-by-N frequency division multi-phase circuit 307 is configured to frequency divide the input reference clock by two and supplies two phase sampling clocks of mutually opposite phases to the two AD converters 301 and 302. For simplicity, FIG. 12 shows two juxtaposed AD converters 301 and 302. However, N (being an integer larger than two, for example) AD converters may be of course juxtaposed.

The two AD converters 301 and 302 carry out respective converting operations in response to the sampling phases which are different according to the multi-phase clocks output from the divide-by-N frequency division multi-phase circuit 307 and output the digital signals. The digital signals output from the two AD converters 301 and 302 are supplied to the correction circuit 303 for timing correction. Then, the digital signals are converted to serial data by the parallel-to-serial converter 304 and sequentially supplied to the adaptive equalizer 305.

The adaptive equalizer 305 receives the digital signal from the parallel-to-serial converter 204 and carries out equalization processing. That is, the adaptive equalizer 305 carries out transmission line compensation, and carries out time-domain adaptive equalization processing (compensation for a gain and a phase) on the signal transmitted through the transmission line and then received at the receiver, for example.

The digital signal with a waveform thereof equalized by the adaptive equalizer 305 is supplied to the decision unit 306, where decision of a received symbol (discrimination of the data) is carried out. By comparing the magnitude of the equalized output of the adaptive equalizer 305 with the magnitude of a predetermined decision threshold, level decision is carried out at the decision unit 306. In the case of multi-valued levels, the number of decision thresholds becomes (the number of the multi-valued levels)−1. In the case of an NRZ (Non Return to Zero) code waveform series, level decision in each bit position is generally executed by sampling at the center of the each bit position (decision point).

The decision unit 306 carries out decision (identification) of the received symbol upon receipt of the equalized output of the adaptive equalizer 305. The decision unit also carries out calculation of a decision error necessary for updating the filter coefficients of the adaptive equalizer 305. That is, the decision unit 306 outputs the error between an equalized output $z_n$ of the adaptive equalizer 305 and a reference signal $r_n$ as a decision error $e_n$ of $r_n - z_n$. Incidentally, as the reference signal $r_n$, a code point at which the distance between a possible symbol value and the equalized output is minimized may be employed. Alternatively, a predetermined known symbol may be employed.

The decision error output from the decision unit 306 is fed back to the adaptive equalizer 305. The adaptive equalizer 305 is constituted from an adaptive filter for sequentially updating the filter coefficients so as to reduce the value of an objective function (such as the square of the decision error), and with such a configuration, control over the adaptive equalization is carried out.

In the correction circuit 303 in FIG. 12, correction described in the Patent Document 1 or 2, for example, is carried out as correction of the characteristics of the AD converters 301 and 302.

[Patent Document 1]

JP Patent Kokai Publication No. JP-P2002-100988A

[Patent Document 2]

U.S. Pat. No. 6,522,282 B1

[Nonpatent Document 1]

Simon Haykin, "Adaptive Filter Theory" translated by Hiroshi Suzuki et al., KAGAKU GIJUTSU SHUPPANSHA, Inc., page 414.

SUMMARY OF THE DISCLOSURE

As described above, in order to implement the higher speed and higher accuracy, the correction circuit is required in the time-interleaved AD conversion device. That is, as shown in FIG. 12, it is essential to provide the correction circuit 303 in the receiver in order to correct variations in the AD converters 301 and 302. Then, processing, a sequence for correcting the timing variations of the AD converters 301 and 302 are required in the correction circuit 303.

As described above, when the receiver is configured so that the correction circuit is provided, it is necessary to add a circuit, the processing, and the sequence unnecessary for a normal adaptive equalizer in the receiver, thus making it difficult to downsize the circuit and simplify the processing.

On the other hand, in order not to require the correction circuit for correcting the variations in the AD converters in the time-interleaved AD conversion device, it is necessary to reduce the variations in the AD converters. However, when a configuration is made so that the variations in the AD converters are reduced without using the correction circuit, the degree of difficulty in design is increased, and an increase in the cost is thus brought about. Further, it becomes difficult to cope with various variations after product shipment such as a power supply variation and an aging variation.

The invention disclosed in the present application is generally configured as follows:

A receiving device according to one aspect of the present invention includes:

a plurality of analog-to-digital converters (referred to as "AD converters") for inputting a received analog signal, converting the received analog signal to digital signals to output the digital signals, responsive to sampling clock signals of mutually different phases; and at least one filter provided corresponding to each of the plurality of AD converters, for inputting the output of the each of the plurality of AD converters corresponding thereto;

wherein filter coefficients of the filter are variably controlled so that an error between the output of the filter and a target value is reduced; and wherein the filter carries out adaptive equalization and also carries out correction of characteristics of the corresponding AD converter.

The receiving device according to the present invention includes a decision unit for deciding a received symbol upon receipt of the output of the filter; and the filter coefficients of the filter are updated based on a decision error from the decision unit.

The receiving device according to the present invention includes at least:

a first filter provided corresponding to one AD converter of the plurality of AD converters, for inputting the output of the one AD converter; and a second filter for inputting the output of other AD converter; and a decision unit provided corresponding to the one AD converter, for deciding a received symbol upon receipt of a signal combining the output of the first filter with the output of the second filter;

wherein the filter coefficients of the first filter and the filter coefficients of the second filter are updated based on a decision error from the decision unit.

In the receiving device according to the present invention, the filter carries out correction of at least one of the sampling phase and the gain of the corresponding AD converter.

The receiving device according to the present invention may further includes a circuit for receiving the output of the AD converter and supplying to the corresponding filter a signal with a DC offset component thereof cancelled from the output of the AD converter.

The receiving device according to other aspect of the present invention includes at least:

first and second filter provided corresponding to one and other AD converters of the plurality of AD converters, for inputting the output of the one and other AD converter; and a decision feedback equalizer provided corresponding to the one AD converter, for deciding a received symbol upon receipt of a signal combining the output of the first filter with the output of the second filter and also outputting a decision error;

wherein the filter coefficients of the first filter and the filter coefficients of the second filter are updated based on the decision error output from the decision feedback equalizer.

In the receiving device according to the present invention, the decision feedback equalizer is provided in common with the plurality of AD converters;

the receiving device further includes:

a multiplexing circuit for receiving in parallel signals combining the outputs of the first and second filters and multiplexing the signals, for supply to the decision feedback equalizer, the first and second filters being provided corresponding to the each of the plurality of AD converters, the number of the signals corresponding to the number of the plurality of AD converters; and a demultiplexing circuit for sequentially receiving from the decision feedback equalizer the decision error output together with the received symbol and supplying the decision error to the first and second filters for the corresponding AD converter, the decision feedback equalizer sequentially receiving the multiplexed output of the multiplexing circuit.

The receiving device according to another aspect of the present invention may include an echo canceller including a filter with filter coefficients thereof variably controlled; and a signal combining the output of the corresponding AD converter of the plurality of AD converters with the output of the echo canceller may be input to the filter corresponding to the AD converter.

An analog-to-digital conversion device according to another aspect of the present invention is a time-interleaved analog-to-digital conversion device which includes:

a plurality of analog-to-digital converters (referred to as "AD converters") for inputting an analog signal and converting the analog signal to digital signals, for output, responsive to sampling clock signals of mutually different phases; and at least one filter provided corresponding to each of the plurality of AD converters, for inputting the output of the each of the plurality of AD converters;

wherein filter coefficients of the filter are adaptively changed so that an error between the output of the filter and a target value is reduced; and wherein the filter carries out adaptive equalization of an input signal waveform and also carries out correction of characteristics of the corresponding AD converter.

The analog-to-digital conversion device according to the present invention may include a decision unit for receiving the output of the filter and deciding an input signal; wherein the filter coefficients of the filter may be updated based on a decision error from the decision unit.

The analog-to-digital conversion device according to the present invention may include at least: a first filter provided corresponding to one AD converter of the plurality of AD converters, for inputting the output of the one AD converter; and a second filter for inputting the output of other AD converter.

The analog-to-digital conversion device may further includes a decision unit provided corresponding to the one AD converter, for deciding an input signal upon receipt of a signal combining the output of the first filter with the output of the second filter; and the filter coefficients of the first filter and the second filter may be updated based on a decision error from the decision unit.

In the analog-to-digital conversion device according to the present invention, the filter may carry out correction of at least one of the sampling phase and the gain of the corresponding AD converter.

The analog-to-digital conversion device according to the present invention may further include a circuit for receiving the output of the AD converter and canceling a direct-current (DC) offset component from the output of the AD converter, for output.

The present invention includes the plurality of AD converters driven by sampling clocks of mutually different phases. A filter for correcting the characteristics of each of the AD converters and an adaptive filter for transmission line equalization are configured using a common filter. The coefficients of the filter for correcting the characteristics of the each of the AD converters can be thereby sequentially corrected.

The meritorious effects of the present invention are summarized as follows.

According to the present invention, by using the adaptive filter for executing adaptive equalization also as the filter of the type of which the coefficients can be changed for AD converter correction, sampling phase compensation of the AD converter can be achieved while restraining an increase in the circuit size. Then, a high-speed and high-accuracy AD conversion device can be thereby implemented.

Further, according to the present invention, reduction in power consumption is implemented, and delay design in view of a timing is facilitated.

Still further, according to the present invention, by providing the adaptive filter for each of the AD converters, compensation for variations in a gain and a skew, together with line compensation, are carried out.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
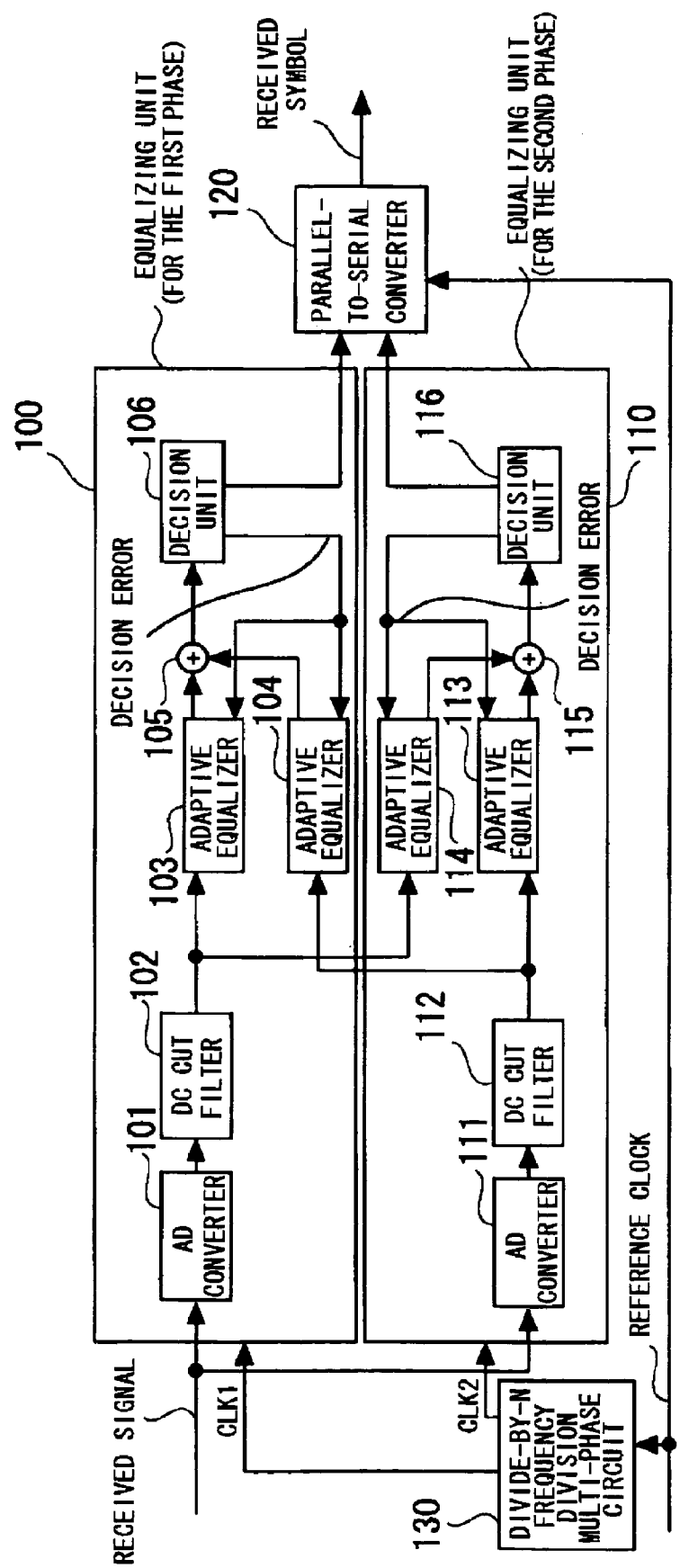
FIG. 1 is a diagram showing a configuration of an embodiment of the present invention.

The embodiment of the present invention will be described below in more detail with reference to the appended drawings. A receiving device according to a preferred embodiment of the present invention includes at least two AD converters (101, 111), a circuit (130), adaptive filters (103, 104), adaptive filters (113, 114), and decision units (106, 116). The AD converters (101, 111) receive a received analog signal as an input, and convert the received analog signal to digital signals for output, in response to sampling clock signals. The circuit (130) carries out frequency division of a reference clock and generates sampling clock signals (CLK1, CLK2) of mutually different phases to supply the sampling clock signals (CLK1, CLK2) to the two AD converters (101, 111), respectively. The adaptive filters (103, 104) receive the digital signals that have been converted and output in synchronization with the sampling clock signals (CLK1, CLK2), respectively, and are driven by the sampling clock signal (CLK1). The adaptive filters (113, 114) receive the digital signals that have been converted and output in synchronization with the sampling clock signals (CLK1, CLK2), respectively, and are driven by the sampling clock signal (CLK2). The decision units (106, 116) receive the combined value of the outputs of the adaptive filters (103, 104) and the combined value of the outputs of the adaptive filters (113, 114), respectively, identify received symbols, and output decision errors, respectively. Filter coefficients of each of the adaptive filters (103, 104) and the adaptive filters (113, 114) are variably controlled one by one so that an objective function defined by each of the decision errors output from the decision units (106, 116) is optimized. Adaptive equalization for a transmission line is thereby carried out, and correction of characteristics (e.g. correction of a gain and a phase) of the AD converters (101, 111) is also carried out.

As described above, in the present invention, by using an adaptive filter for AD converter correction also as the adaptive filter for transmission line equalization, sequential correction of the filter coefficients is enabled. That is, in the present invention, the adaptive filter is provided for each AD converter, thereby executing compensation for variations in the gain and a skew as well as the transmission line compensation. Incidentally a configuration in which an equalizer for executing adaptive equalization for the transmission line (channel) compensation is employed for correction in regard to a time-interleaved AD conversion device has not been known before the present application was made. According to the present invention, the adaptive filter is individually provided for each of the AD converters, and in the adaptive filter that inputs the output of the AD converter, the AD converter correction and the adaptive equalization of the transmission line are carried out.

In the time-interleaved AD conversion device, variations in an offset, the gain and the skew are sometimes generated among a plurality of the AD converters. However, by employing the present invention, characteristic deterioration can be suppressed even if the variations among the AD converters are present.

Further, in the present invention, a DC cut filter is employed in the output stage of each of the AD converters. The variations in the offset in each of the AD converters are thereby eliminated. Further, the operating clock for the adaptive filter is slowed down by an amount corresponding to a frequency division ratio. Design in view of reduction of power consumption and delay will become facilitated. That is, as a secondary effect, reduction of the power consumption and delay design in view of a timing are facilitated. A detailed description will be given below.

Figure 2:
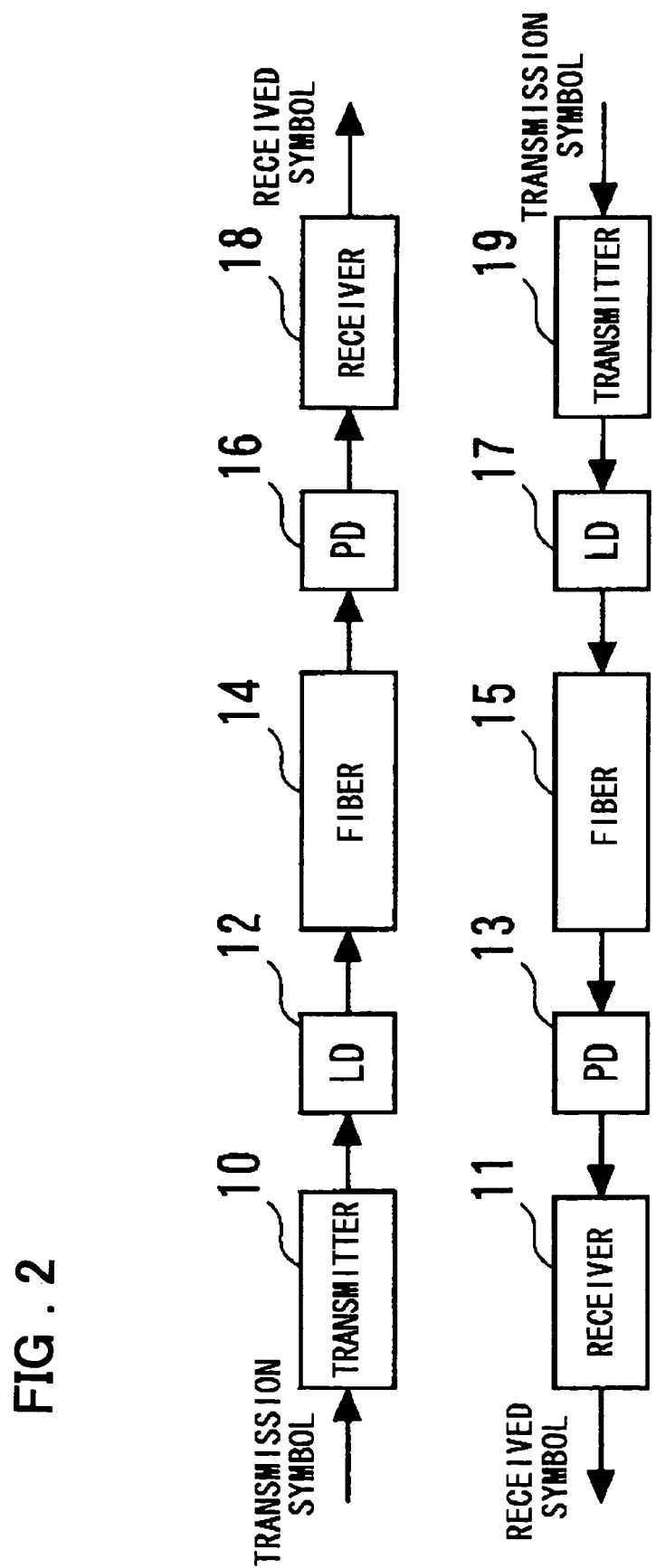
FIG. 2 is a diagram showing a configuration of a system to which the present invention is applied.
Figure 3:
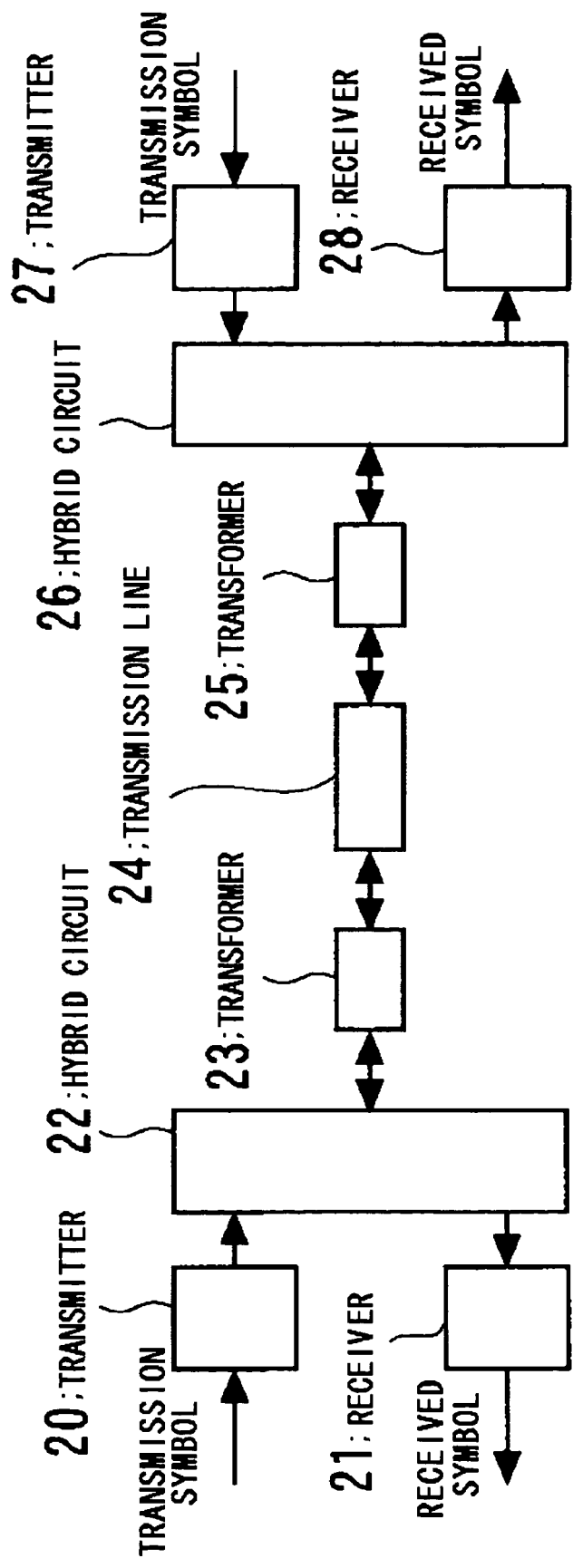
FIG. 3 is a diagram showing a configuration of a system to which the present invention is applied.

FIG. 1 is a diagram showing a configuration of a receiver according to a first embodiment of the present invention. The receiver given below is employed as a receiver shown in FIGS. 2 and 3, for example.

Referring to FIG. 1, the receiver in the present embodiment includes the two AD converters 101 and 111, DC (direct-current) cut filters 102 and 112, the adaptive equalizers 103 and 104, the adaptive equalizers 113 and 114, adders 105 and 115, the decision units 106 and 116, a parallel-to-serial converter 120, and the divide-by-N frequency division multi-phase circuit 130. The AD converters 101 and 111 receive a received analog signal input and convert the analog signal to digital signals in response to the sampling clocks CLK1 and CLK2 of mutually different phases, for output. The DC cut filters 102 and 112 input the digital signals output from the two AD converters 101 and 111, respectively. The adaptive equalizers 103 and 104 input the outputs of the DC cut filters 102 and 112, respectively, and are driven in common by the sampling clock CLK1. The adaptive equalizers 113 and 114 input the outputs of the DC cut filters 112 and 102, respectively, and are driven in common by the sampling clock CLK2. The adder 105 adds digital signals output from the adaptive equalizers 103 and 104. The adder 115 adds digital signals output from the adaptive equalizers 113 and 114. The decision units 106 and 116 input the output signals of the adders 105 and 115, respectively. The parallel-to-serial converter 120 receives symbols decided by the decision units 106 and 116 in parallel, multiplexes them, and serially outputs them as received symbols. The divide-by-N frequency division multi-phase circuit 130 frequency divides a reference clock by two and generates the sampling clocks CLK1 and CLK2 (multi-phase clocks) mutually shifted by a half period of the clock cycle of a frequency divided clock. A decision error output from the decision unit 106 is fed back to the adaptive equalizers 103 and 104. A decision error output from the decision unit 116 is fed back to the adaptive equalizers 113 and 114. The AD converter 101, DC cut filter 102, adaptive equalizers 103 and 104, adder 105, and decision unit 106 constitute an equalizing unit 100 for a first phase. The AD converter 111, DC cut filter 112, adaptive equalizers 113 and 114, adder 115, and decision unit 116 constitute an equalizing unit 110 for a second phase. The adaptive equalizers 103 and 104 and the adaptive equalizers 113 and 114 have the same configuration. A description will be given below based on an example where a linear equalizer for executing equalization in a time domain is employed. The description will be given in connection with an example where an FIR (finite impulse response) filter is employed as the adaptive equalizer in the time domain and an LMS (Least Mean Square) is employed as a tap updating algorithm. The present invention, however, is not limited to this configuration. A filter including a tap updating unit and a filter unit of which filter coefficients can be changed according to an algorithm for reducing an objective function based on an error between an output signal and a target signal is referred to as the adaptive filter (ADF). The relationship between the adaptive equalizer and the adaptive filter in this application will be described. The adaptive filter (ADF) constitutes each of the adaptive equalizers 103, 104, 113, and 114.

Each component and its operation in the receiver shown in FIG. 1 will be described below. The divide-by-N frequency division multi-phase circuit 130 (in which N is two) constituted from a divide-by-two frequency division circuit frequency divides the reference clock by two, generates the sampling clock signals CLK1 and CLK2 shifted to each other by a half period with respect to the clock cycle of a frequency divided clock, and supplies the sampling clock signals CLK1 and CLK2 to the AD converters 101 and 111, respectively. The AD converters 101 and 111 sample the received analog signal at different phases based on the sampling clock signals CLK1 and CLK2, respectively to convert the received analog signal to the digital signals for output.

The direct current components (DC offset components) of the digital signals output from the AD converters 101 and 111 are cut off by the DC cut filters 102 and 112, respectively.

Figure 4:
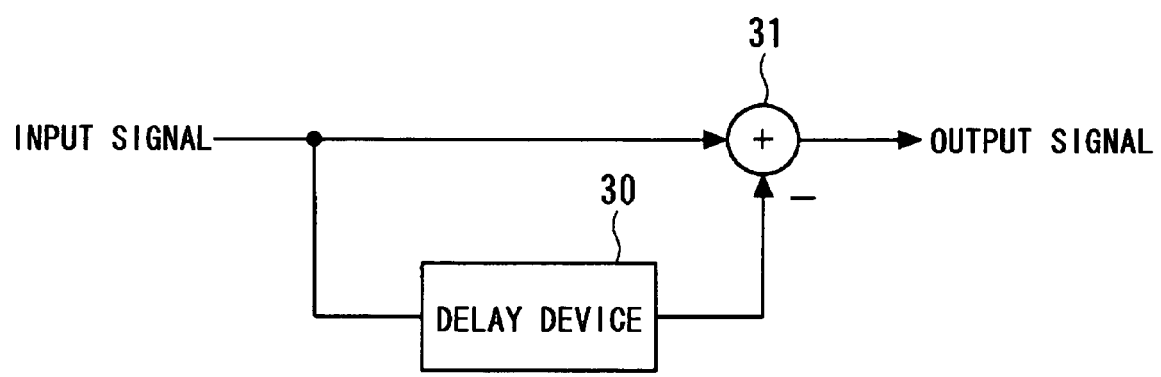
FIG. 4 is a diagram showing a configuration of a DC cut filter in the embodiment of the present invention.

FIG. 4 shows an example of a configuration of the DC cut filter 102 and 112. Referring to FIG. 4, the DC cut filter includes a delay device 30 for delaying an input signal and an adder 31 for adding the input signal to the output of the delay device 30 with a minus sign appended thereto. This adder 31 functions as a subtractor for subtracting the delayed output of the delay device 30 from the input signal, for output.

The DC cut filter 102 in FIG. 1 delays a sampled value D(N) and subtracts the sampled value D(N) from a sampled value D(N+2) and makes its difference of D(N+2)−D(N) to be an output signal thereof, thereby removing the direct current components (DC components), for example. The sampled values D(N) and D(N+2) are the Nth sampled value and the (N+2)th sampled value (delayed by two clocks of the reference clock) sampled in response to the sampling clock signal CLK1 at the AD converter 101. Further, the DC cut filter 112 in FIG. 1 delays a sampled value D(N+1) and subtracts the sampled value D(N+1) from a sampled value D(N+3) and makes its difference of D(N+3)−D(N+1) to be an output signal thereof, thereby removing the direct current components (DC components), for example. The sampled values D(N+1) and D(N+3) are the (N+1)th sampled value and the (N+3)th sampled value (delayed by two clocks of the reference clock) sampled in response to the sampling clock signal CLK2 at the AD converter 111.

Referring to FIG. 1, the adaptive equalizers 103 and 114 driven by the sampling clock signals CLK1 and CLK2, respectively, input the digital signal with the direct current component thereof removed from the digital signal converted and output from the AD converter 101 driven by the sampling clock signal CLK1.

The adaptive equalizers 113 and 104 driven by the sampling clock signals CLK2 and CLK1, respectively, input the digital signal with the direct current component thereof cut off from the digital signal converted and output from the AD converter 111 driven by the sampling clock signal CLK2. The adaptive equalizer compensates for the signal waveform distortion of a received signal transmitted through a transmission line.

Figure 5:
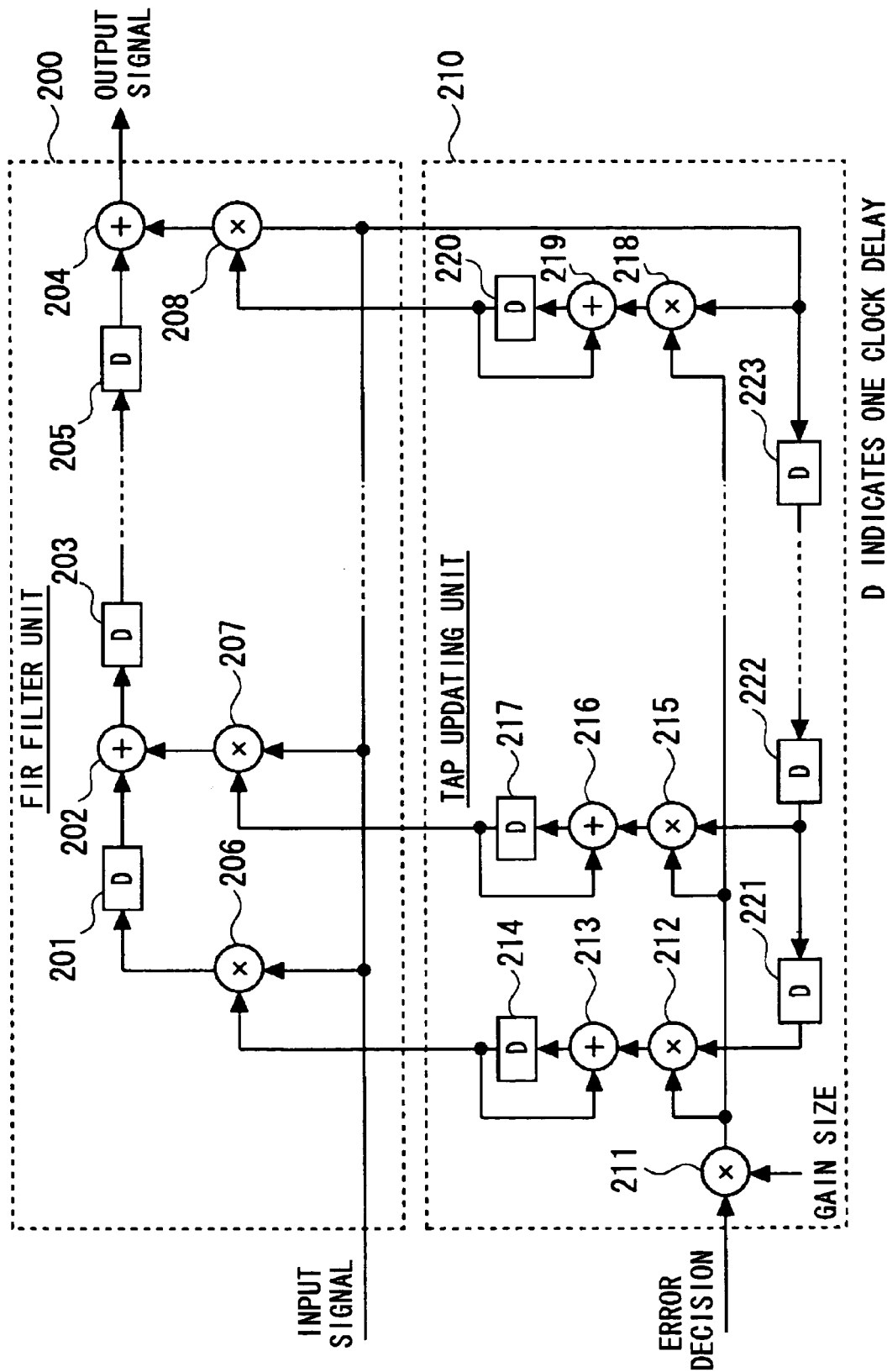
FIG. 5 is a diagram showing a configuration of an adaptive equalizer in the embodiment of the present invention.

FIG. 5 is a diagram showing an example of a configuration of the adaptive equalizer 103, 104, 113, or 114 shown in FIG. 1. Referring to FIG. 5, the adaptive equalizer is configured as the adaptive filter including a filter unit 200 and a tap updating unit 210. The filter unit 200 is constituted from the FIR (Finite Impulse Response) filter. The tap updating unit 210 updates the filter coefficients of the FIR filter unit 200. FIG. 5 shows an example of a configuration of the adaptive filter that uses the LMS (Least Mean Square) algorithm. When the number of order of the filter is indicated by M, an input signal (a discrete time digital signal) is indicated by $x_n$, an output signal is indicated by $y_n$, a decision error is indicated by $e_n$, and filter coefficients 208 to 206 at a time n are indicated by $b_{0,n}, b_{1,n}, \ldots$, and $b_{M,n}$, $y_n$ is given by:

$$y_n = b_{0,n} x_n + b_{1,n} x_{n-1} + \ldots b_{M,n} x_{n-M} \quad (1)$$

in which $x_{n-1}$ is a signal obtained by delaying the input signal by one unit time by a delay element, and $x_{n-M}$ is a signal obtained by delaying the input signal by M unit times by M delay elements.

If respective vectors $B_n$ and $X_n$ are defined as follows,
$B_n = \text{Col}[b_{0,n}, b_{1,n}, \ldots b_{N,n}]$, and
$X_n = \text{Col}[x_n, x_{n-1}, \ldots, x_{n-M}]$
(where Col is an operator for converting a row to a column), $y_n$ is expressed by:

$$y_n = B_n^T X_n \quad (2)$$

According to the well-known LMS algorithm by B. Widrow for tap updating, a filter coefficient $B_{n+1}$ at a time n+1 is given by:

$$B_{n+1} = B_n + v e_n X_n \quad (3)$$

That is, referring to FIG. 5, the tap updating unit 210 supplies the filter coefficient $B_n$ at the current time n to multipliers 206 to 208 and stores the filter coefficient Bn in storage elements (D-type registers) 214, 217, . . . and 220. Then, for updating to the filter coefficient $B_{n+1}$ at the next time n+1, multiplication of $Xn = \text{Col}[x_n, x_{n-1}, \ldots, x_{n-M}]$ by a gain v and an error en by multipliers 218, 215, . . . , and 212 and then adding the resulting value to the value $Bn = [b_{0,n}, b_{1,n}, \ldots b_{N,n}]$ in the storage elements (D-type registers) 220, 217, and 214 by the adders 213, 216, . . . , and 219 are carried out. According to this LMS algorithm, the optimum tap gain is gradually approached. The filter coefficients may be of course variably controlled by an RLS (Recursive Least Squares) algorithm or the like. Referring to FIG. 5, for simplicity, a description was given in connection with an example in which the FIR filter having a linear phase characteristic was employed. However, the invention is not limited to the FIR filter, of course. Further, the description was given, with the equalizer in the time domain taken as an example of the adaptive equalizer. The present invention can also be applied to an equalizer that carries out adaptive equalization in a frequency domain.

Referring again to FIG. 1, the outputs of the adaptive equalizers 103 and 104 are added by the adder 105, and input to the decision unit 106. The outputs of the adaptive equalizers 113 and 114 are added by the adder 115 and input to the decision unit 116.

Upon receipt of the output of the adder 105, the decision unit 106 carries out decision of the received symbol and calculates the decision error that is for updating the tap coefficients of the adaptive equalizers 103 and 104.

Upon receipt of the output of the adder 115, the decision unit 116 carries out decision of the received symbol and calculates the decision error that is for updating the tap coefficients of the adaptive equalizers 113 and 114.

The decision units 106 and 116 make decision on data from the outputs of the adders 105 and 115, respectively. When a code transmitted through the transmission line is a binary code, the decision units 106 and 116 make decision according to whether the level of the output (combination of equalized outputs) is higher or lower than a decision threshold. When the code transmitted through the transmission line is a multivalued code series, the number of decision thresholds becomes (the number of multivalued levels) minus one.

Further, the decision units 106 and 116 measure an error between the output (equalized output) of the adder 105 and a reference signal (the ideal value of the equalized output) and an error between the output (equalized output) of the adder 115 and the reference signal (the ideal value of the equalized output), respectively, and respectively output the error as a decision error signal en=rn−zn. As a reference signal rn, the most proximate code point (code point in most proximity to the equalized output), a known symbol series, or the like is employed.

When the digital signal output series of the AD converter 101 for sampling an input analog signal series by the sampling clock CLK1 and converting the sampled analog signal series to the digital signals is indicated by D0, D2, D4, and D6, and the digital signal output series of the AD converter 111 for sampling the input analog signal series by the sampling clock CLK2 and converting the sampled analog signal series to the digital signals is indicated by D1, D3, D5, . . . , the decision unit 106 carries out level decision at the central point (decision point) of each bit position of the D0, D2, and D4, for example, and also carries out the level decision in view of the D1, D3, and D5 delayed by the half period. The decision unit 116 carries out the level decision at the central point (decision point) of each bit position of the D1, D3, and D5, for example, and also carries out the level decision in view of the D0, D2, D4, and D6 advanced or delayed by the half period. In the case of an NRZ (Non Return to Zero) code waveform, when the level decision is carried out, level decision at each bit position is generally achieved by executing sampling at the central point (decision point) of the each bit position.

The two symbols output from the decision units 106 and 116 are supplied to the parallel-to-serial converter 120 in parallel, and serially output as a received symbol series synchronized to the reference clock.

In the present embodiment, by using the FIR filter of the type of which the coefficients can be changed (refer to reference numeral 200 in FIG. 5) that constitutes a correction circuit for the AD converter as the adaptive FIR filter for transmission line equalization (refer to reference numeral 200 in FIG. 5) as well, iterative correction of the filter coefficients is enabled.

Further, in the present embodiment, the equalizing unit 100 for the first phase supplies to the decision unit 106 a signal obtained by combination (result of addition) of an adaptively equalized signal that indicates data sampled by the sampling clock signal CLK1 of the first phase with an adaptively equalized signal that indicates data sampled by the sampling clock signal CLK2 of the second phase. The equalizing unit 110 for the second phase supplies to the decision unit 116 a signal obtained by combination (result of addition) of an adaptively equalized signal that indicates data sampled by the sampling clock signal CLK1 of the first phase with an adaptively equalized signal that indicates data sampled by the sampling clock signal CLK2 of the second phase. Each of the decision units 106 and 116 makes decision on the symbol. With this arrangement, even when a waveform transmitted through the transmission line is distorted and received, having spread beyond one symbol segment (which is one-bit segment in binary NRZ transmission and 1 baud=1 bps), adaptive equalization is carried out in view of the signal indicating an adjacent symbol. Waveform equalization can be therefore practiced with a good accuracy. In the embodiment described above, a description was given, based on an example in which the receiver is applied to an optical transmission system and a wired transmission system shown in FIGS. 2 and 3. However, in the case of a wireless system (that uses a wireless channel as the transmission line) for executing orthogonal modulation of a carrier wave by a transmission symbol and executing wireless transmission through an antenna, the decision unit in the receiver carries out decision of the multivalued levels of the equalized output of a complex baseband signal quadrature demodulated on an in-phase and quadrature axises, for 16 QAM (Quadrature Amplitude Modulation), or 64 QAM.

The operation and effect of the present embodiment will be described below.

According to the present embodiment, phase adjustment is carried out by the adaptive filter of the type of which the coefficients can be changed, for the AD converter correction, and correction of a sampling phase offset is carried out. Thus, strict phase compensation becomes possible. Further, design in view of reduction in power consumption and a timing delay is facilitated. Together with line (transmission line) compensation by the adaptive filter, the compensation for the variations in the gain and the skew is carried out. In addition, according to the present invention, DC offset compensation for the AD converter is carried out by the DC cut filter.

Figure 6:
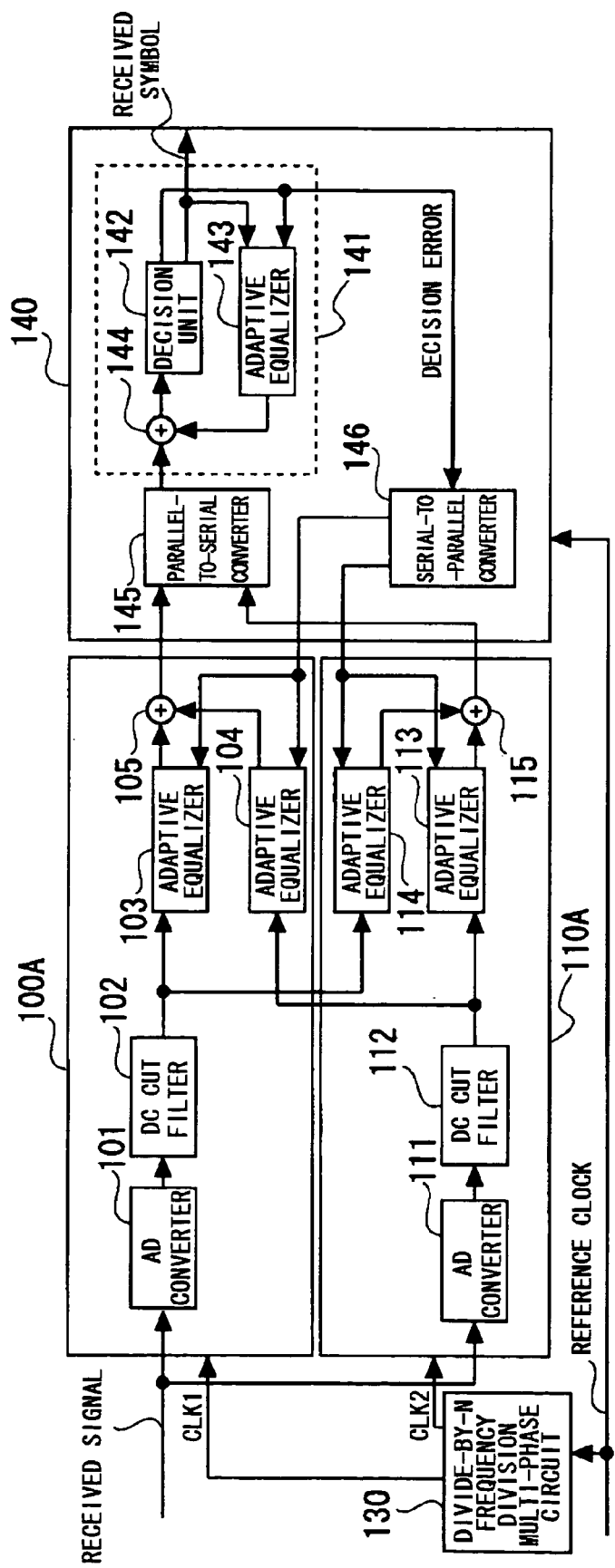
FIG. 6 is a diagram showing a configuration of other embodiment of the present invention.

Next, a second embodiment of the present invention will be described. FIG. 6 is a diagram showing a configuration of the second embodiment of the present invention. Referring to FIG. 6, same reference characters are assigned to components that have the same configurations as those in FIG. 1. Description of the same components as those in the embodiment shown in FIG. 1 will be therefore omitted. A description will be mainly directed to a difference. Referring to FIG. 6, the present embodiment employs a decision feedback equalizer (DFE) 141.

Referring to FIG. 6, the AD converter 101, DC cut filter 102, adaptive equalizers 103 and 104, and adder 105 constitute an equalizing unit 100A for the first phase. The AD converter 111, DC cut filter 112, adaptive equalizers 113 and 114, and adder 115 constitute an equalizing unit 110A for the second phase. The outputs of the equalizing units 100A and 110A are supplied to an equalizing unit 140 in a subsequent stage. That is, the outputs of the adder 105 of the equalizing unit 100A and the adder 115 of the equalizing unit 110A are supplied to a parallel-to-serial converter 145 for conversion to serial data, and then input to the decision feedback equalizer 141. The equalizing units 100A and 110A are respectively driven by the sampling clock signals CLK1 and CLK2, output from the divide-by-N frequency division multi-phase circuit 130, which carries out frequency division of the reference clock by two. The parallel-to-serial converter 145 and a serial-to-parallel converter 146 in the equalizing unit 140 operate in response to the reference clock. The decision feedback equalizer 141 also operates in response to the reference clock. The decision feedback equalizer is constituted by including an equalizing filter unit, a data decision unit, an equalizing error estimation unit, and a tap updating unit (that uses the LMS algorithm or the like), for example. Referring to FIG. 6, an adaptive equalizer 143 carries out respective functions of the equalizing filter unit and the tap updating unit, and a decision unit 142 is provided as the decision unit and equalizing error estimation unit.

The equalizing filter unit in the decision feedback equalizer 141 includes an FF tap (FIR filter) for synthesizing present or future data as seen from a center tap, and an FB tap (FIR filter) for synthesizing past data as seen from the center tap, as is well known. In the case of a two-wave Rayleigh fading model constituted from two waves of a direct wave and a delayed wave, for example, when the direct wave is larger than the delayed wave, the replica of the delayed wave is created using an input to the FB tap. Then, by adding this replica to a received signal (an output of the parallel-to-serial converter 145) by an adder 144, a direct wave component is extracted, for supply to the decision unit 142. The decision error from the decision unit 142 is converted in parallel by the serial-to-parallel conversion circuit 146, for supply to the adaptive equalizers 103 and 104 and the adaptive equalizers 113 and 114, respectively.

Being different from the embodiment described before, the present embodiment includes only one decision unit.

Figure 7:
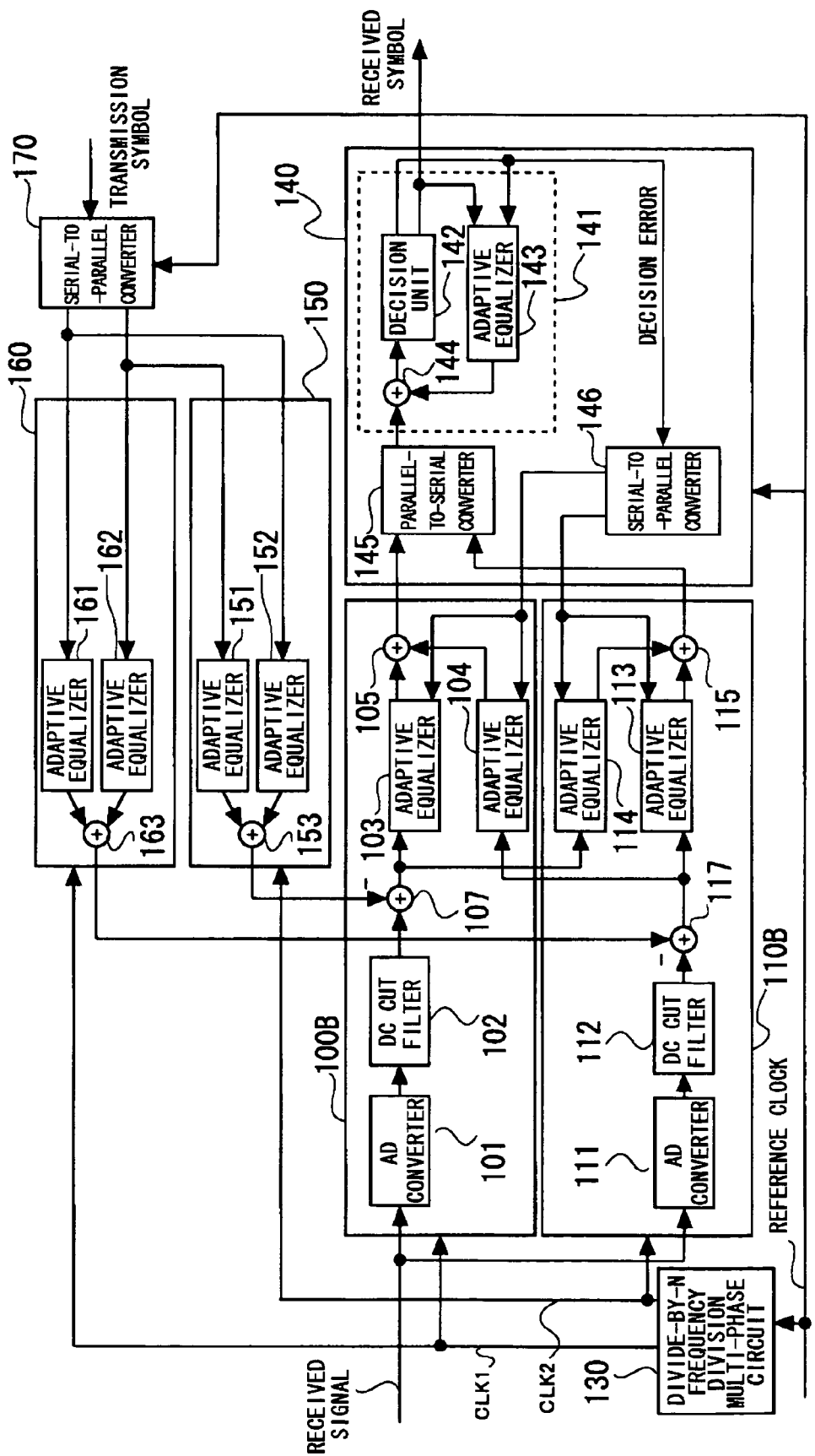
FIG. 7 is a diagram showing a configuration of other embodiment of the present invention.

Next, a third embodiment of the present invention will be described. FIG. 7 is a diagram showing a configuration of the third embodiment of the present invention. Referring to FIG. 7, same reference characters are assigned to the components that have the same configurations as those in FIG. 6. Description of the same components as those in the embodiment shown in FIG. 6 will be therefore omitted. A description will be mainly directed to a difference. Referring to FIG. 7, in a receiver according to the present embodiment, an echo canceller function is added to the configuration shown in FIG. 6, and the receiver according to the present embodiment is used as receivers 21 and 28 in the transmission system (full duplex system) shown in FIG. 3, for example. In this case, the receivers 21 and 28 receive transmission symbols from transmitters 20 and 27, respectively, for example, and cancel an echo and a near-end crosstalk noise.

Referring to FIG. 7, the present embodiment employs the decision feedback equalizer 141 as in the second embodiment shown in FIG. 6, and further includes echo canceling units 150 and 160.

A serial-to-parallel converter 170 driven by the reference clock serially inputs even-numbered and odd-numbered transmission symbols one by one from a transmitter not shown, for conversion to parallel data. The serial-to-parallel converter 170 supplies a common transmission symbol (an even-numbered symbol) to adaptive equalizers (adaptive filters) 151 and 152, and supplies a common transmission symbol (an odd-numbered symbol) to adaptive equalizers (adaptive filters) 161 and 162.

The outputs of the adaptive equalizers 151 and 152 both driven by the sampling clock signal CLK2 supplied to an equalizing unit 110B are added by an adder 153, and the result of addition is supplied to one input to an adder 107 of the equalizing unit 100B. The outputs of the adaptive equalizers 161 and 162 driven by the sampling clock signal CLK1 supplied to the equalizing unit 100B are added by an adder 163, and the result of addition is supplied to one input to an adder 117 of the equalizing unit 110B.

The adder 107 of the equalizing unit 100B supplies the result of addition of the output of the DC cut filter 102 and the output of the adder 153 to the adaptive equalizer 103 of the equalizing unit 100B and the adaptive equalizer 114 of the equalizing unit 110B. The adder 117 of the equalizing unit 110B supplies the result of addition of the output of the DC cut filter 112 and the output of the adder 163 to the adaptive equalizer 113 of the equalizing unit 110B and the adaptive equalizer 104 of the equalizing unit 100B.

The parallel-to-serial converter 145 and the serial-to-parallel converter 146 of the equalizing unit 140 operate in response to the reference clock. The decision feedback equalizer 141 also operates in response to the reference clock. Further, the serial-to-parallel converter 170 operates in response to the reference clock.

According to the present embodiment, noises such as the echo and a crosstalk can be adaptively cancelled.

Figure 8:
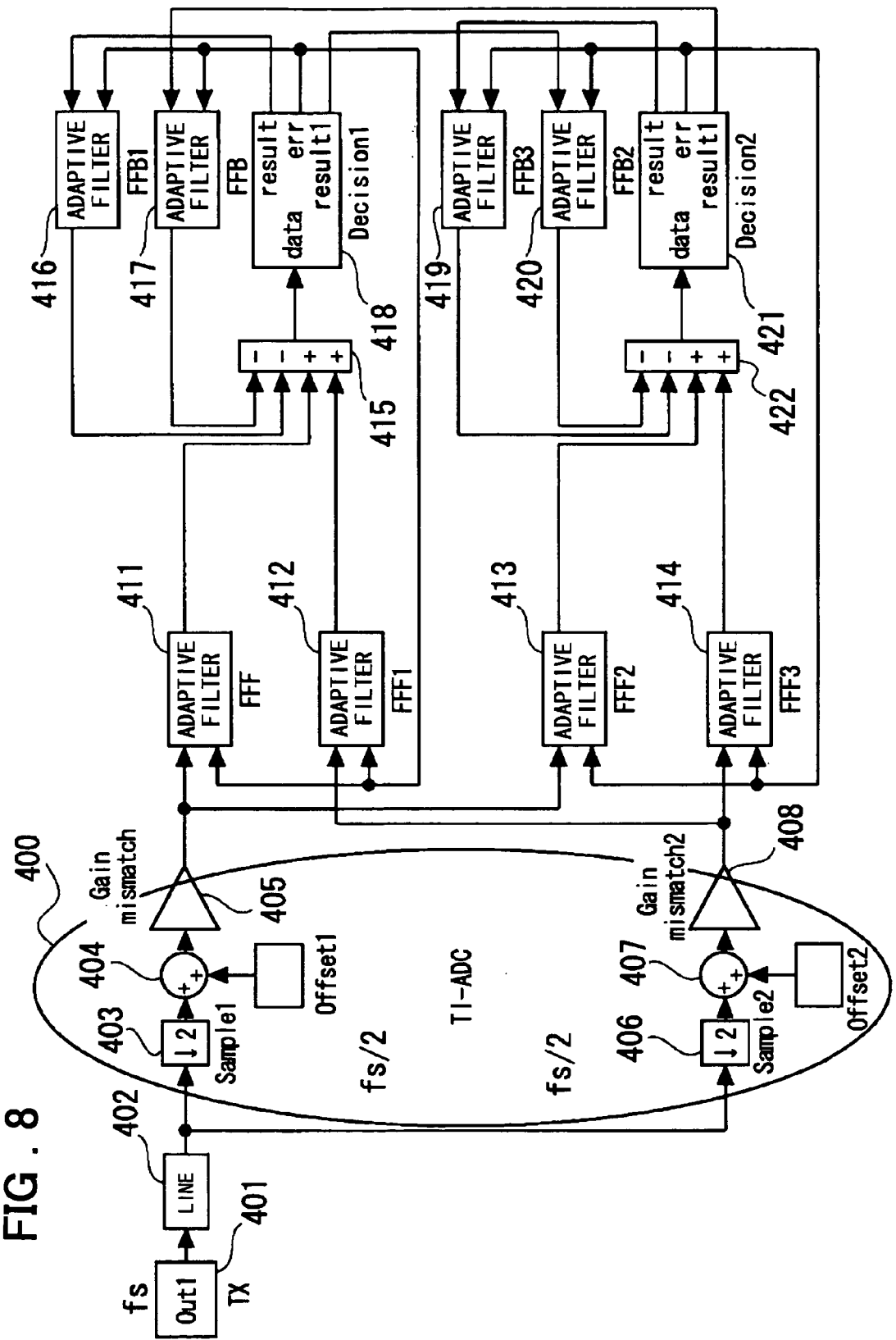
FIG. 8 is a diagram showing a configuration of a still other embodiment of the present invention.

Next, a fourth embodiment of the present invention will be described. FIG. 8 is a diagram showing a specific example to which the present invention has been applied, and is the diagram showing a configuration of a receiver having an MIMO (Multiple-Input Multiple-Output) filter configuration. Referring to FIG. 8, the DC cut filters are omitted.

Referring to FIG. 8, a transmitter (TX) 401 transmits a symbol to a line 402 at a frequency fs. A time-interleaved AD conversion device (TI-ADC) 400 in a receiver is constituted from two AD converters connected in parallel, for sampling even-numbered data and odd-numbered data, respectively, in response to the sampling clock signal of mutually different phases and a frequency of fs/2 obtained by dividing the fs by two. Each of the two AD converters includes a sampler 403/406, an adder 404/407 for adding the output of the sampler 403/406 to a DC offset (Offset 1/Offset 2), and an amplifier 405/408 for inputting the output of the adder 404/407. The offset (Offset 1) of one of the AD converters is set to 0.2, and the gain mismatch (Gain mismatch 1) of the one of the AD converters is set to 0.8, for example. The offset (Offset 2) of the other AD converter is set to −0.3, and the gain mismatch (Gain mismatch 2) of the other AD converter is set to 1.2, for example.

Referring to FIG. 8 as well, the output of the one of the AD converters is supplied to adaptive filters 411 and 413 and the output of the other AD converter is supplied to adaptive filters 414 and 412, as in the configurations in FIGS. 1 and 6. The outputs of the adaptive filters 411 and 412 are supplied to an adder 415. The output of the adder 415 is supplied to a data terminal of a decision unit (Decision 1) 418. The decision unit 418 outputs and supplies the result of decision to an adaptive filter 416 that constitutes the decision feedback equalizer (DFE). The result of decision (result 1) is supplied to an adaptive filter 420 that constitutes the decision feedback equalizer (DFE), and an adaptive error (err) is supplied to the adaptive filters 411 and 412, the adaptive filter 416, and an adaptive filter 417.

The outputs of the adaptive filters 413 and 414 are supplied to an adder 422, and the output of the adder 422 is supplied to a data terminal of a decision unit (Decision 2) 421. The decision unit 421 outputs and supplies the result of decision to an adaptive filter 419 that constitutes the decision feedback equalizer (DFE). The result of decision (result 1) is supplied to the adaptive filter 417 that constitutes the decision feedback equalizer (DFE). The decision error (err) is supplied to the adaptive filters 413 and 414, and the adaptive filters 419 and 420.

The outputs of the adaptive filters 416 and 417 are supplied to the adder 415, and are subtracted from the outputs of the adaptive filters 411 and 412. The outputs of the adaptive filters 419 and 420 are supplied to the adder 422, and are subtracted from the outputs of the adaptive filters 413 and 414. Referring to FIG. 8, the adaptive filter (ADF) is the one comparable to the adaptive equalizers in FIG. 1 and FIG. 6 and is constituted from the configuration (adaptive equalizer) shown in FIG. 5.

Figure 9:
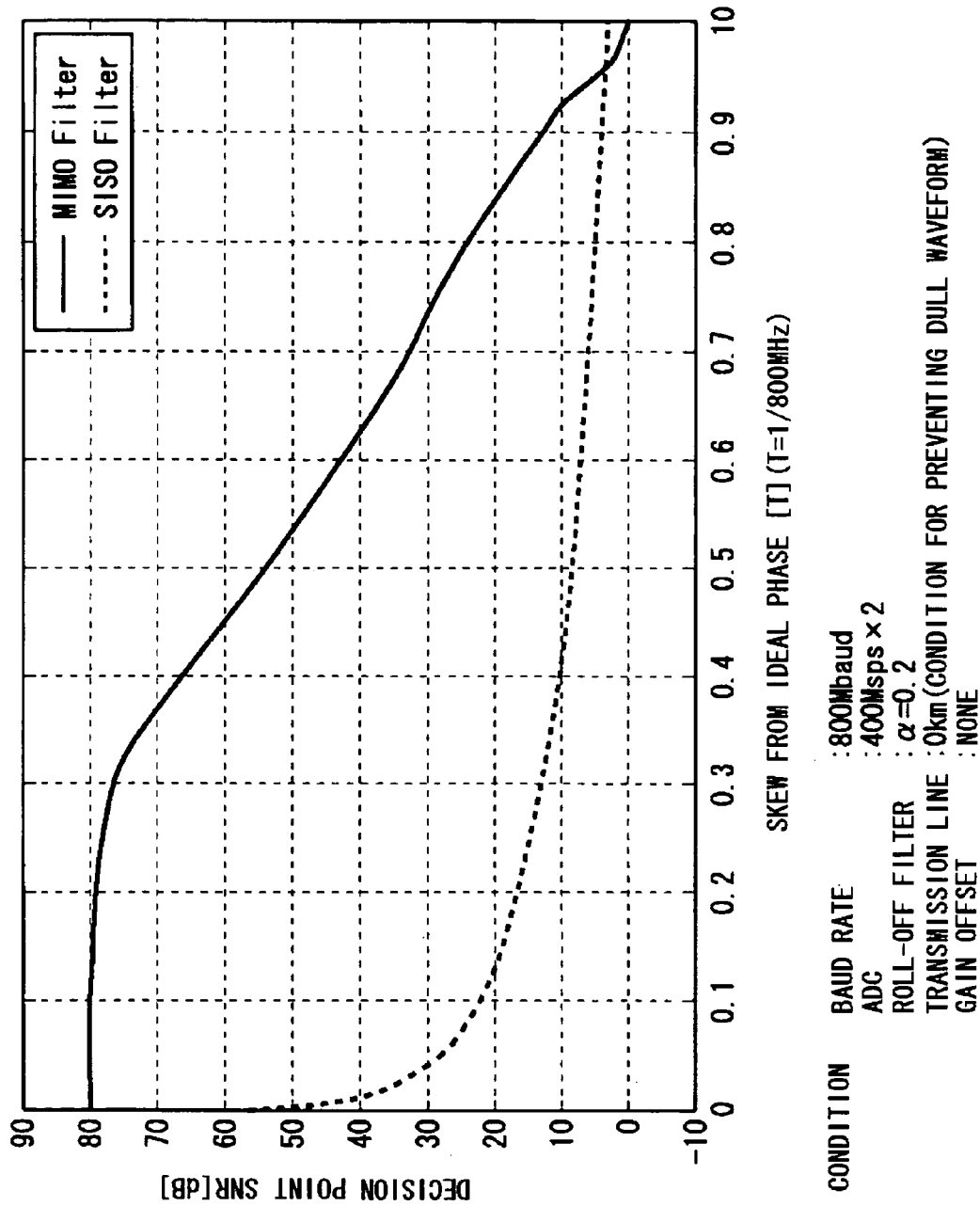
FIG. 9 is a graph showing the result of simulation according to the present invention.
Figure 10:
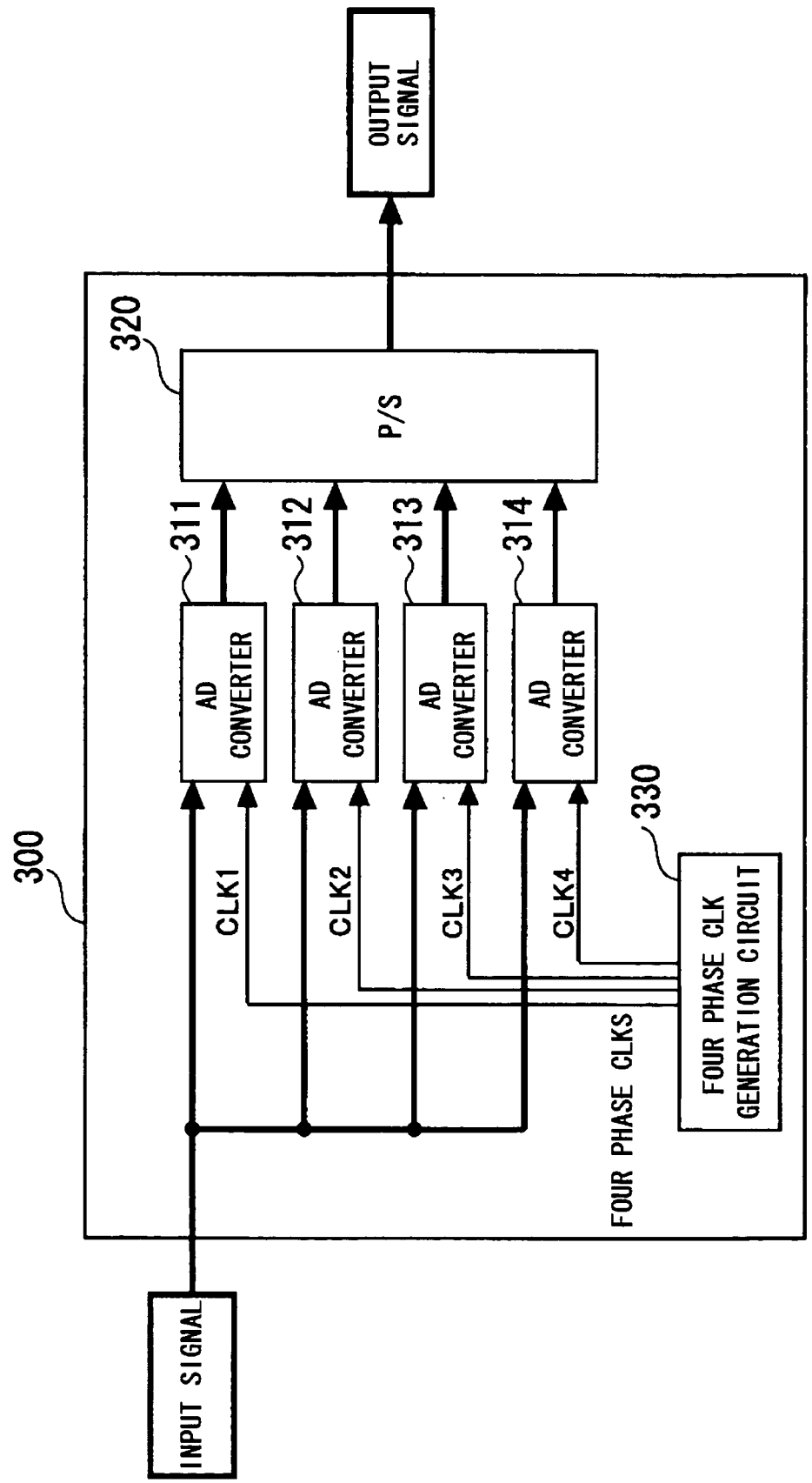
FIG. 10 is a diagram showing an example of a configuration of a conventional time-interleaved AD conversion device.
Figure 11:
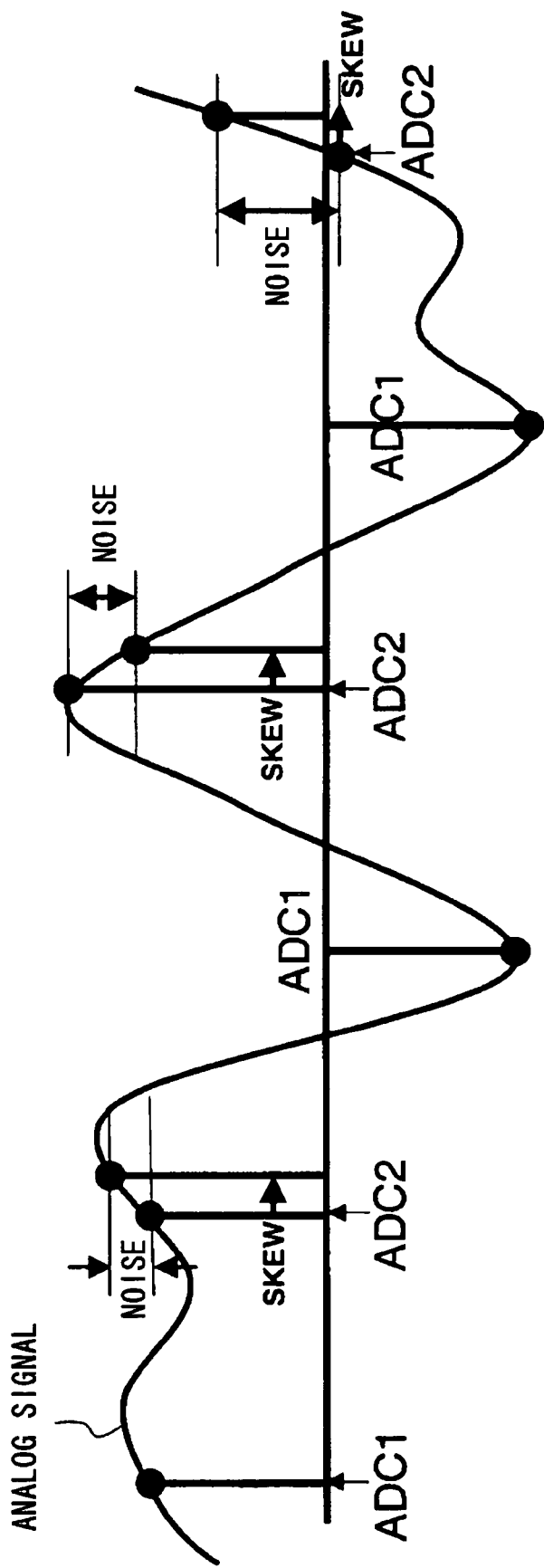
FIG. 11 is a diagram showing a relationship between a skew and an error in the time-interleaved AD conversion device.
Figure 12:
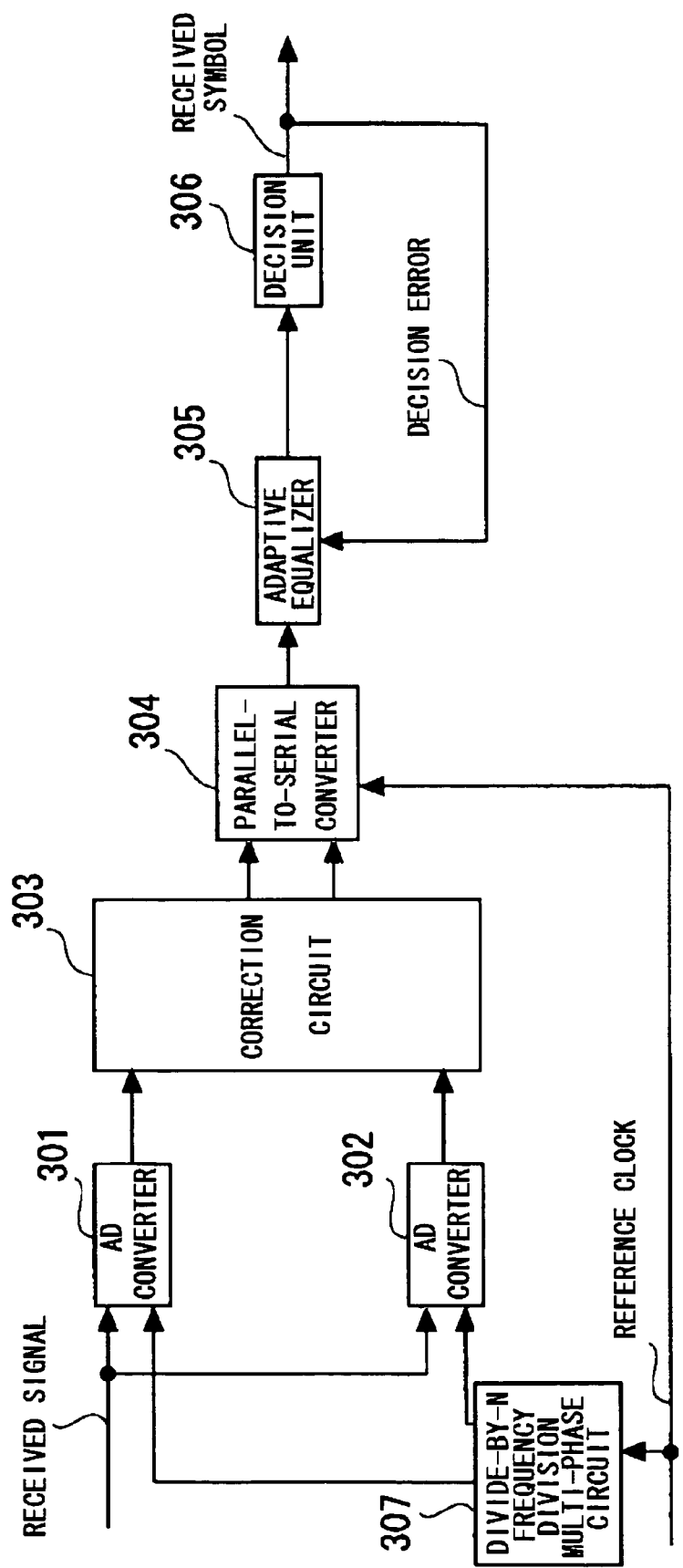
FIG. 12 is a diagram showing a configuration of a receiver using a time-interleaved AD conversion device.

FIG. 9 is a graph showing the characteristic of the MIMO (Multiple-Input Multiple-Output) filter (indicated by a solid line) in a receiver having the configuration of the MIMO filter shown in FIG. 8 and the characteristic of an SISO (Single Input Single Output) filter (indicated by a broken line) as a comparative example, with respect to the relationship (characteristic) between a skew (a unit thereof being 1/800 MHz) from an ideal phase and the symbol error rate (dB) of the decision point. As shown in FIG. 9, the graph is the one indicating the result of simulation under a condition in which a baud rate is set to 800 Mbaud, the conversion rate of the ADC is set to 400 Msps (800 Msps is implemented by the two ADCs in parallel), a roll off rate α of a cosine roll-off filter that constitutes a band limiting filter is set to 0.2, and the transmission line (the line 402 in FIG. 8) is 0 Km (of the condition in which a waveform does not become dull), and no gains and no offsets.

The SNR (symbol to noise ratio) of the decision point (e.g. at the center of the bit position for the level decision) of the SISO filter becomes less than 20 dB when a skew from the ideal phase is 0.2 in ratio. However, in the configuration of the MIMO filter, the SNR of approximately 80 dB is maintained. Further, the SNR of the decision point of the SISO filter becomes approximately 10 dB when the skew from the ideal phase becomes 0.4. In the MIMO filter, however, the SNR of approximately 67 dB is maintained. As described above, according to the MIMO filter in the present embodiment, even if the deviation of a sampling phase (a skew from the ideal phase) becomes considerably large, the SNR of an decided received symbol can be kept to be satisfactory.

The above description was given in connection with the embodiments described above. The present invention, however, is not limited to the configurations of the embodiments described above alone, and of course includes various variations and modifications pursuant to the principle of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A receiving device comprising:
a plurality of analog-to-digital converters for inputting a received analog signal and converting the analog signal to digital signals for output, responsive to plural sampling clock signals of mutually different phases, said sampling clock signals being independent from outputs of said analog-to-digital converters; and
at least one filter provided corresponding to each of said plurality of analog-to-digital converters, for receiving an output of said each of said plurality of analog-to-digital converters,
wherein filter coefficients of said filter are adaptively changed such that an error between an output of said filter and a target value is reduced, and
wherein said filter carries out adaptive equalization and carries out correction of characteristics of the corresponding analog-to-digital converter.

2. The receiving device according to claim 1, further comprising a decision unit for deciding a received symbol upon receipt of an output of the filter,
wherein the filter coefficients of the filter are updated based on a decision error from the decision unit.

3. The receiving device according to claim 1, further comprising:
first and second filters provided corresponding to one analog-to-digital converter of said plurality of analog-to-digital converters, said first and second filters receiving outputs of said one analog-to-digital converter and an other analog-to-digital converter respectively; and
a decision unit provided corresponding to the one analog-to-digital converter, for deciding a received symbol upon receipt of a signal and receiving as an input a combining of an output of the first filter with an output of the second filter,
wherein the filter coefficients of the first filter and the filter coefficients of the second filter are updated based on a decision error output from the decision unit.

4. The receiving device according to claim 1, wherein the filter carries out correction of at least one of a sampling phase and a gain of the corresponding analog-to-digital converter.

5. The receiving device according to claim 1, further comprising a circuit for receiving an output of the analog-to-digital converter, and supplying a signal obtained by canceling a direct-current offset component from the output of the analog-to-digital converter to the corresponding filter.

6. The receiving device according to claim 1, further comprising:
first and second filters provided corresponding to one analog-to-digital converter of said plurality of analog-to-digital converters, said first and second filters receiving outputs of said one analog-to-digital converter and an other analog-to-digital converter respectively; and
a decision feedback equalizer provided corresponding to the one analog-to-digital converter, for deciding a received symbol upon receipt of a signal and receiving as an input a combining of an output of the first filter with an output of the second filter and also outputting a decision error,
wherein the filter coefficients of the first filter and the filter coefficients of the second filter are updated based on the decision error output from said decision feedback equalizer.

7. The receiving device according to claim 6, wherein said decision feedback equalizer is provided in common with said plurality of analog-to-digital converters, and
wherein said receiving device further comprises:
a multiplexing circuit for receiving in parallel signals combining the outputs of the first and second filters and multiplexing the signals, for supplying to said decision feedback equalizer, the first and second filters being provided corresponding to said each of said plurality of analog-to-digital converters, a number of the signals corresponding to a number of said plurality of analog-to-digital converters; and
a demultiplexing circuit for sequentially receiving from said decision feedback equalizer the decision error output together with the received symbol and supplying the decision error to the first and second filters for the corresponding analog-to-digital converter, said decision feedback equalizer sequentially receiving a multiplexed output of said multiplexing circuit.

8. The receiving device according to claim 1, further comprising an echo canceller including a filter with filter coefficients thereof variably controlled,
wherein a signal combining the output of a corresponding analog-to-digital converter of said plurality of analog-to-digital converters with an output of the echo canceller is supplied to the filter corresponding to the analog-to-digital converter.

9. The receiving device according to claim 1, wherein a sampling clock signal in said plural sampling clock signals drives said filter.

10. A receiving device comprising:
first and second analog-to-digital converters for inputting a received analog signal and executing conversion of the analog signal to digital signals to output the digital signals, responsive to first and second sampling clock signals of mutually different phases, respectively;
first and second adaptive equalizers for receiving outputs of said first analog-to-digital converter and said second analog-to-digital converter, respectively, and being driven by the first sampling clock signal;
third and fourth adaptive equalizers for receiving outputs of said first analog-to-digital converter and said second analog-to-digital converter, respectively, and being driven by the second sampling clock signal;
a first adder for receiving outputs of said first and second adaptive equalizers at first and second inputs thereof and adding the outputs to output a result of the addition;
a second adder for receiving outputs of said third and fourth adaptive equalizers at first and second inputs thereof and adding the outputs to output a result of the addition;
a first decision unit for receiving an output of said first adder, being driven by the first sampling clock signal, and deciding a first received symbol to output the first received symbol, and also outputting a first decision error;
a second decision unit for receiving an output of said second adder, being driven by the second sampling clock signal, and deciding a second received symbol to output the second received symbol, and also outputting a second decision error; and
a multiplexing circuit for multiplexing the first and second received symbols output from said first and second decision units,
wherein the first decision error from said first decision unit is supplied to said first and second adaptive equalizers, and coefficients of first and second filters constituting said first and second adaptive equalizers are updated respectively, and
wherein the second decision error from said second decision unit is supplied to said third and fourth adaptive equalizers, and coefficients of third and fourth filters constituting said third and fourth adaptive equalizers are updated respectively.

11. The receiving device according to claim 10, further comprising a generation circuit for receiving an input reference clock signal and executing frequency division of the reference clock signal to generate the first and second sampling clock signals of the mutually different phases.

12. The receiving device according to claim 11, wherein said multiplexing circuit is driven by the reference clock.

13. The receiving device according to claim 10, further comprising:
first and second direct-current cut filters for receiving the outputs of said first and second analog-to-digital converters, respectively, and cut-off direct current components of the outputs;
an output of said first direct-current cut filter being connected in common to inputs to said first and fourth adaptive equalizers; and an output of said second direct-current cut filter being connected in common to inputs to said second and third adaptive equalizers.

14. The receiving device according to claim 13, wherein each of said first and second direct-current cut filters comprises:
a delay circuit for delaying an input signal; and
a subtractor for subtracting an output of said delay circuit from the input signal.

15. The receiving device according to claim 13, further comprising:
first and second echo cancellers each comprising adaptive filters for respectively inputting a transmission symbol;
a third adder for adding an output of said first direct-current cut filter and an output of said first echo canceller;
a fourth adder for adding an output of said second direct-current cut filter and an output of said second echo canceller;
an output of said third adder being connected in common to inputs to said first and fourth adaptive equalizers; and
an output of said fourth adder being connected in common to inputs to said second and third adaptive equalizers.

16. A receiving device comprising:
first and second analog-to-digital converters for inputting a received analog signal and executing conversion of the analog signal to a digital signal to output the digital signal, responsive to first and second sampling clock signals of mutually different phases, respectively;
first and second adaptive equalizers for receiving outputs of said first analog-to-digital converter and said second analog-to-digital converter, respectively and being driven by the first sampling clock signal;
third and fourth adaptive equalizers for receiving outputs of said second analog-to-digital converter and said first analog-to-digital converter, respectively and being driven by the second sampling clock signal;
a first adder for receiving outputs of said first and second adaptive equalizers and adding the outputs received to output the added result;
a second adder for receiving outputs of said third and fourth adaptive equalizers and adding the outputs received to output the added result;
a multiplexing circuit for receiving an output of said first adder and an output of said second adder in parallel, and multiplexing the outputs, for output;
a decision feedback equalizer for sequentially receiving an output of said multiplexing circuit, deciding first and second received symbols corresponding to the outputs of said first and second analog-to-digital converters, respectively, to output the first and second received symbols, and also sequentially outputting first and second decision errors corresponding to the decided first and second received symbols; and
a demultiplexing circuit for sequentially receiving the first and second decision errors sequentially output from said decision feedback equalizer, supplying the first decision error to said first and second adaptive equalizers, and supplying the second decision error to said third and fourth adaptive equalizers.

17. The receiving device according to claim 16, wherein said decision feedback equalizer comprises:
a decision unit;
an adaptive equalizer for receiving the received symbol and the decision error output from said decision unit; and
an adder for adding an output of said adaptive equalizer to an output of said multiplexing circuit and then supplying a result of the addition to said decision unit.

18. The receiving device according to claim 16, further comprising:
a generation circuit for receiving a reference clock and frequency dividing the reference clock to generate the first and second sampling clock signals of the mutually different phases.

19. The receiving device according to claim 18, wherein said decision feedback equalizer, said multiplexing circuit, and said demultiplexing circuit are driven by the reference clock.

20. A time-interleaved analog-to-digital conversion device comprising:
a plurality of analog-to-digital converters for receiving an analog input signal and converting the analog signal to digital signals to output the digital signals, responsive to sampling clock signals of mutually different phases, said sampling clock signals being independent from outputs of said analog-to-digital converters; and
at least one filter provided corresponding to each of said plurality of analog-to-digital converters, for receiving an output of said each of said plurality of analog-to-digital converters,
wherein filter coefficients of said filter are adaptively changed so that an error between an output of said filter and a target value is reduced, and
wherein said filter carries out adaptive equalization of a waveform of the input signal and also carries out correction of characteristics of the corresponding analog-to-digital converter.

21. The analog-to-digital conversion device according to claim 20, further comprising a decision unit for receiving an output of said filter and deciding an input signal,
wherein the filter coefficients of said filter are updated based on a decision error output from said decision unit.

22. The analog-to-digital conversion device according to claim 20, further comprising:
first and second filters provided corresponding to one analog-to-digital converter out of said plurality of analog-to-digital converters, said first and second filters receiving outputs of said one analog-to-digital converter and an other analog-to-digital converter respectively; and
a decision unit provided corresponding to the one analog-to-digital converter, for deciding an input signal upon receipt of a signal and receiving as an input a combining of an output of the first filter with an output of the second filter,
wherein the filter coefficients of the first filter and the second filter are updated based on a decision error from the decision unit.

23. The analog-to-digital conversion device according to claim 20, wherein the filter carries out correction of at least one of a sampling phase and a gain of the corresponding analog-to-digital converter.

24. The analog-to-digital conversion device according to claim 20, further comprising a circuit for receiving an output of the analog-to-digital converter and canceling a Direct-current offset component from the output of the analog-to-digital converter, for output.

* * * * *